US012586755B2

(12) United States Patent
Hoinkis et al.

(10) Patent No.: US 12,586,755 B2
(45) Date of Patent: Mar. 24, 2026

(54) APPARATUS FOR ANALYZING AND/OR PROCESSING A SAMPLE WITH A PARTICLE BEAM AND METHOD

(71) Applicants: Carl Zeiss SMT GmbH, Oberkochen (DE); Elke Hoinkis, Hessen (DE)

(72) Inventors: Ottmar Hoinkis, Darmstadt (DE); Jan Guentner, Gross-Zimmern (DE); Daniel Rhinow, Frankfurt am Main (DE); Hubertus Marbach, Grossostheim (DE); Nicole Auth, Ginsheim-Gustavsburg (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 485 days.

(21) Appl. No.: 18/121,755

(22) Filed: Mar. 15, 2023

(65) Prior Publication Data

US 2023/0238213 A1     Jul. 27, 2023

Related U.S. Application Data

(63) Continuation of application No. PCT/EP2021/075476, filed on Sep. 16, 2021.

(30) Foreign Application Priority Data

Sep. 17, 2020   (DE) .......................... 102020124307.3

(51) Int. Cl.
*H01J 37/28*          (2006.01)
*H01J 37/147*        (2006.01)
(Continued)

(52) U.S. Cl.
CPC ............ *H01J 37/28* (2013.01); *H01J 37/147* (2013.01); *H01J 37/16* (2013.01); *H01J 37/224* (2013.01); *H01J 37/244* (2013.01); *H01J 37/261* (2013.01)

(58) Field of Classification Search
CPC .......... H01J 37/28; H01J 37/147; H01J 37/16; H01J 37/224; H01J 37/244; H01J 37/261;
(Continued)

(56) References Cited

U.S. PATENT DOCUMENTS 5,591,971 A * 1/1997 Shahar .................... H01J 37/28
                                                                    250/307
6,080,986 A     6/2000 Dowsett et al.
(Continued)

FOREIGN PATENT DOCUMENTS

CN        101714491 A      5/2010
CN        111293017 A      6/2020 ............. H01J 37/04
(Continued)

OTHER PUBLICATIONS

The Office Action issued by the German Patent Office for Application No. DE 10 2020 124 307.3, dated Oct. 22, 2024 (with English Translation).
(Continued)

*Primary Examiner* — David A Vanore
(74) *Attorney, Agent, or Firm* — Fish & Richardson P.C.

(57)          ABSTRACT

An apparatus for analyzing and/or processing a sample with a particle beam includes a providing unit for providing the particle beam, and a shielding element for shielding an electric field (E) generated by charges (Q) accumulated on the sample. The shielding element has a through opening for the particle beam to pass through towards the sample. The apparatus further includes a detecting unit configured to detect an actual position of the shielding element, and an adjusting unit for adjusting the shielding element from the actual position into a target position.

20 Claims, 5 Drawing Sheets

(51) Int. Cl.

| | |
|---|---|
| *H01J 37/16* | (2006.01) |
| *H01J 37/22* | (2006.01) |
| *H01J 37/244* | (2006.01) |
| *H01J 37/26* | (2006.01) |

(58) Field of Classification Search
CPC ......... H01J 2237/004; H01J 2237/0206; H01J 2237/0458; H01J 37/09; H01J 37/026
See application file for complete search history.

(56) References Cited

U.S. PATENT DOCUMENTS

| | | | |
|---|---|---|---|
| 9,520,263 B2 * | 12/2016 | Case ..................... | H01J 35/147 |
| 11,145,487 B2 * | 10/2021 | Li ......................... | H01J 37/145 |
| 2001/0002697 A1 | 6/2001 | Hiroi et al. | |
| 2002/0148960 A1 * | 10/2002 | Todokoro ............... | H01J 37/28 |
| | | | 250/310 |
| 2004/0183014 A1 | 9/2004 | Kagawa | |
| 2008/0099693 A1 * | 5/2008 | Platzgummer ...... | H01J 37/3007 |
| | | | 250/398 |
| 2009/0220256 A1 * | 9/2009 | Suhara ............... | G03G 15/5037 |
| | | | 399/32 |
| 2010/0119698 A1 * | 5/2010 | Bihr .................... | H01J 37/3056 |
| | | | 427/8 |
| 2012/0235036 A1 | 9/2012 | Hatakeyama et al. | |
| 2012/0273458 A1 | 11/2012 | Bret et al. | |
| 2017/0154752 A1 | 6/2017 | Essers et al. | |
| 2017/0323764 A1 * | 11/2017 | Muto ..................... | H01J 37/08 |
| 2018/0358199 A1 * | 12/2018 | Kumamoto ............. | H01J 37/28 |
| 2020/0185185 A1 | 6/2020 | Essers | |
| 2023/0215688 A1 * | 7/2023 | Schmaunz .............. | H01J 37/28 |

FOREIGN PATENT DOCUMENTS

| | | | | |
|---|---|---|---|---|
| DE | 102017208114 | 5/2018 | .............. | G03F 1/74 |
| EP | 1 587 128 B1 | 10/2005 | .............. | H01J 37/02 |
| JP | 1982-080730 | 5/1982 | ............. | H01L 21/66 |
| JP | 11-072451 | 3/1999 | ........... | G01N 23/225 |
| JP | 1999-204395 | 7/1999 | ........... | H01L 21/027 |
| JP | 2005-109344 | 4/2005 | ........... | H01L 21/027 |
| JP | 2005-518638 | 6/2005 | ............. | H01J 37/30 |
| JP | 2007-533089 | 11/2007 | ............. | H01J 37/20 |
| JP | 2008-112999 | 5/2008 | ........... | H01L 21/027 |
| JP | 2008-258149 | 10/2008 | ........... | H01J 37/317 |
| JP | 2017-143147 | 8/2017 | ........... | H01L 21/027 |
| JP | 2018-195592 | 12/2018 | ............. | H01J 37/22 |
| JP | 6591681 B2 * | 10/2019 | ........... | H01J 37/141 |
| KR | 1020070007930 | 1/2007 | | |
| TW | 201634917 A | 10/2016 | ........... | G01N 23/22 |
| WO | WO 2005/101451 | 10/2005 | ............. | H01J 37/02 |
| WO | WO 2018/025849 | 2/2018 | ............. | H01J 37/04 |
| WO | WO 2020/016843 | 1/2020 | ............. | H01J 37/09 |
| WO | WO-2024135419 A1 * | 6/2024 | ........ | G01N 23/2251 |

OTHER PUBLICATIONS

The Office Action issued by the Japanese Patent Office for Application No. JP 2023-517676, dated Feb. 26, 2024 (with English Translation).

The Notice of Allowance issued by the Korean Patent Office for Application No. KR 10-2023-7012436, dated Jul. 29, 2025 (with English Translation).

The International Search Report and Written Opinion of the International Searching Authority for International Application No. PCT/EP2021/075476, dated Mar. 14, 2022.

Okai et al., "Study on Image Drift Induced by Charging during Observation by Scanning Electron Microscope", *Japanese Journal of Applied Physics*, vol. 51, pp. 06FB11-1-06FB11-7 (2012).

The Office Action issued by the Korean Patent Office for Application No. KR 10-2023-7012436, dated Dec. 12, 2024 (with English Translation).

Office Action and Search Report in Chinese Appln. No. 202180063679.7, mailed on Dec. 5, 2025, 17 pages (with English translation).

\* cited by examiner

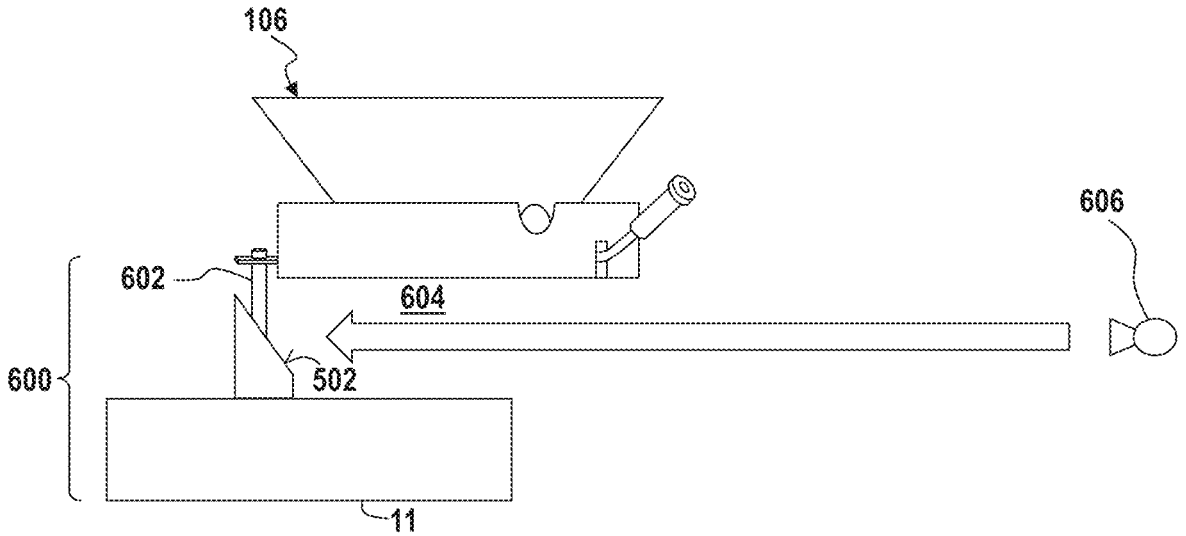
Fig. 6
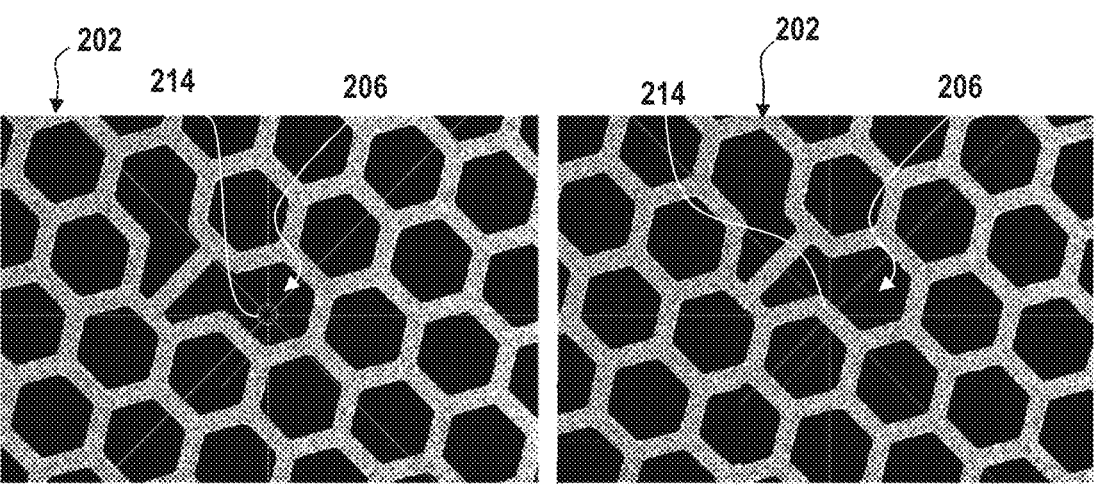
Fig. 7A                                    Fig. 7B

APPARATUS FOR ANALYZING AND/OR PROCESSING A SAMPLE WITH A PARTICLE BEAM AND METHOD

CROSS-REFERENCE TO RELATED APPLICATIONS

This application is a continuation of and claims priority under 35 U.S.C. § 120 from PCT Application No. PCT/EP2021/075476, filed on Sep. 16, 2021, which claims priority from German Application No. 10 2020 124 307.3, filed on Sep. 17, 2020. The entire contents of each of these priority applications are incorporated herein by reference.

TECHNICAL FIELD

The present invention relates to an apparatus for analyzing and/or processing a sample with a particle beam and to a corresponding method.

BACKGROUND

Microlithography is used for producing microstructured components, such as, for example, integrated circuits. The microlithography process is performed using a lithography apparatus, which has an illumination system and a projection system. The image of a mask (reticle) illuminated by use of the illumination system is in this case projected by use of the projection system onto a substrate, for example a silicon wafer, which is coated with a light-sensitive layer (photoresist) and arranged in the image plane of the projection system, in order to transfer the mask structure to the light-sensitive coating of the substrate.

The mask or lithography mask is used for a great number of exposures, and so it is of huge importance for said mask to be free of defects. Therefore, a correspondingly great effort is made to examine lithography masks for defects and to repair identified defects. Defects in lithography masks may have an order of magnitude in the range of a few nanometers. Repairing such defects necessitates apparatuses that offer a very high spatial resolution for the repair processes.

Appropriate apparatuses for this purpose activate local etching or deposition processes on the basis of particle beam-induced processes.

EP 1 587 128 B1 discloses one such apparatus that uses a beam of charged particles ("particle beam"), in particular an electron beam of an electron microscope, for initiating the chemical processes. Use of charged particles can give rise to charging of the sample provided that the latter is not or only poorly conductive. This can lead to uncontrolled beam deflection, which limits the achievable process resolution. It is therefore proposed to arrange a shielding element very close to the processing position, thereby minimizing the charging of the sample and improving the process resolution and control.

SUMMARY

In particular, an electron microscope is known which comprises a shielding element in the form of a metallic shielding element situated e.g. 70-80 μm above the mask. The shielding element usually has openings, for example round, rectangular or hexagonal meshes, and is held in the desired position by a holder. The holder is an integral part of the component in which both the electrostatic deflection system and the gas feed are integrated. The particle beam is intended to be guided along the optical axis of the electron microscope through a specific opening of the shielding element. Hitherto this has required complex adjustment of the shielding element by firstly generating a vacuum, detecting the position of the shielding element with the electron microscope and manually displacing the holder together with grids—after breaking the vacuum. This process is repeated until the corresponding opening is situated at the suitable position.

Against this background, it is an aspect of the present invention to provide an improved apparatus for analyzing and/or processing a sample with a particle beam, and also an improved method.

In accordance with a first aspect, an apparatus for analyzing and/or processing a sample with a particle beam is proposed. The apparatus comprises:

a providing unit for providing the particle beam;

a shielding element for shielding an electric field generated by charges accumulated on the sample, wherein the shielding element has a through opening for the particle beam to pass through towards the sample;

a detecting unit configured to detect an actual position of the shielding element; and an adjusting unit for adjusting the shielding element from the actual position into a target position.

This apparatus has the advantage that partly or fully automated adjustment of the position of the shielding element is possible by use of the adjusting unit. In particular, manual adjustment is thus obviated. The vacuum also need no longer be broken. It is particularly advantageous that the shielding element can be observed with regard to its position with the aid of the detecting unit during the entire adjustment process or parts thereof. As a result the iterative process known from the prior art is preferably obviated.

The sample is for example a lithography mask having a feature size in the range of 10 nm-10 μm. This can be for example a transmissive lithography mask for DUV lithography (DUV: "deep ultraviolet", operating light wavelengths in the range of 30-250 nm) or a reflective lithography mask for EUV lithography (EUV: "extreme ultraviolet", operating light wavelengths in the range of 1-30 nm). The analysis comprises in particular acquiring an image of the surface of the sample with the aid of the particle beam. The processing carried out with the aid of the particle beam comprises for example etching processes, in which a material is locally removed from the surface of the sample, deposition processes, in which a material is locally applied to the surface of the sample, and/or similar locally activated processes, such as forming a passivation layer or compacting a layer.

The particle beam comprises charged particles, such as ions, electrons or positrons, for example. The providing unit is an electron column, for example, which can provide an electron beam having an energy in a range of 10 eV-10 keV and a current in a range of 1 μA-1 pA. However, it can also be an ion source that provides an ion beam.

The particle beam is preferably focused onto the surface of the sample, an irradiation region with a diameter in the range of 1 nm-100 nm being achieved, for example. The particle beam composed of charged particles can be influenced, i.e. for example accelerated, directed, shaped and/or focused, by use of electric and magnetic fields. For this purpose, the providing unit can comprise a number of elements configured for generating a corresponding electric and/or magnetic field. Said elements are arranged in particular between the beam generating unit and the shielding element.

The shielding element fulfils the task of shielding the electric field of the charges that have accumulated on the sample, that is to say of spatially delimiting said electric field, in particular to a smallest possible gap between the shielding element and the sample. For this purpose, the shielding element comprises an electrically conductive material. The shielding element comprises a noble metal, for example. By way of example, the shielding element comprises at least one element from the list comprising gold, nickel, palladium, platinum, iridium. In embodiments, the shielding element is formed from gold. By way of example, the shielding element is earthed, such that charges that impinge on the shielding element are dissipated. In a spatial region above the shielding element from where the particle beam comes, an electric field of charges situated on the sample is effectively shielded by the shielding element.

The shielding element itself can be embodied in sheetlike fashion, the sheet preferably forming a three-dimensional shape whose surface has a convex section in the direction of a sample stage for holding the sample. The convex section preferably forms the closest section to the sample stage, that is to say that the distance between the sample stage or the sample and the shielding element is the smallest in the region of the convex section. The convex section extends for example over a distance of at least 100 µm, preferably at least 250 µm, preferably at least 500 µm, in a direction towards the sample stage. Preferably, a difference between the distance between the closest point of the shielding element and the sample stage and the distance between the furthest point of the shielding element and the sample stage is at least 100 µm, preferably at least 250 µm, preferably at least 500 µm. In the convex section, the shielding element can have the through opening, through which the particle beam passes and is incident on the sample. The shielding element can be arranged in such a manner as to close an opening of the providing unit through which the particle beam is guided to a processing position on the sample, and/or the shielding element forms that component of the providing unit which is closest to the sample stage in the beam direction.

By way of example, the shielding element, in particular the convex section thereof, is at a distance from the sample of at most 100 µm, preferably at most 50 µm, preferably at most 25 µm, more preferably at most 10 µm, during an analysis or processing of the sample with the particle beam. The smaller the distance, the less an electrical interference field can influence the particle beam.

Consequently, the particle beam can be accurately controlled and is subject to random and/or uncontrollable interference influences to a lesser extent. A high resolution is thus possible, both during image acquisition, as in a scanning electron microscope, and during processing methods that are carried out with the particle beam, such as particle beam-induced etching or deposition processes, ion implantation, and/or further structure-altering processes.

The shielding element has for example a length and a width in a range of between 1 mm-50 mm. A material thickness of the shielding element is for example in a range of between 1 µm-100 µm, preferably 5 µm-15 µm. The through opening has for example a cross-sectional area in a range of between 100 µm$^2$-2500 µm$^2$, preferably between 400 µm$^2$-1600 µm$^2$, more preferably between 750 µm$^2$-1400 µm$^2$. The through opening has for example a diameter in a range of between 10 µm-50 µm, preferably between 20 µm-40 µm, more preferably between 25 µm-35 µm. The diameter refers for example to the distance between two oppositely arranged points of the through opening.

Any type of sensor is appropriate as detecting unit. In particular, an electron microscope is involved, as explained below. Alternatively, the sensor can be an optical, inductive or capacitive sensor. Preferably, the detecting unit detects both the actual position before adjustment and the new actual position after adjustment (which corresponds to the target position or an intermediate position between the actual and target positions of the shielding element). The detecting unit can be configured to sample the respective actual position of the shielding element with a sampling rate of e.g. greater than 1, greater than 10 or greater than 100 Hz. The actual and/or target position can be detected in each case in relation to an optical axis of the providing unit.

The adjusting unit can comprise one or more motors or actuators. The motors can be electric motors, and the actuators can be electromagnetic actuators.

In particular, a closed-loop control can be provided in such a way that the adjusting unit adjusts the shielding element depending on the actual position of the shielding element (if appropriate at a respective sampling time).

Furthermore, the apparatus can comprise a gas feed configured for feeding a process gas into a gap, wherein the gap is formed by the sample arranged on the sample stage and the shielding element. The process gas flows via the gap to the processing position on the sample. The providing unit comprises for example a circulating plate comprising the opening for the particle beam. The gas feed is effected through the circulating plate, for example.

Appropriate process gases suitable for depositing material or for growing elevated structures in interaction with the particle beam are, in particular, alkyl compounds of main group elements, metals or transition elements. Examples thereof are cyclopentadienyl trimethylplatinum CpPtMe3 (Me=CH4), methylcyclopentadienyl trimethylplatinum MeCpPtMe3, tetramethyltin SnMe4, trimethylgallium GaMe3, ferrocene Cp2Fe, bisarylchromium Ar2Cr, and/or carbonyl compounds of main group elements, metals or transition elements, such as, for example, chromium hexacarbonyl Cr(CO)6, molybdenum hexacarbonyl Mo(CO)6, tungsten hexacarbonyl W(CO)6, dicobalt octacarbonyl Co2 (CO)8, triruthenium dodecacarbonyl Ru3(CO)12, iron pentacarbonyl Fe(CO)5, and/or alkoxide compounds of main group elements, metals or transition elements, such as, for example, tetraethyl orthosilicate Si(OC2H5)4, tetraisopropoxytitanium Ti(OC3H7)4, and/or halide compounds of main group elements, metals or transition elements, such as, for example, tungsten hexafluoride WF6, tungsten hexachloride WCl6, titanium tetrachloride TiCl4, boron trifluoride BF3, silicon tetrachloride SiCl4, and/or complexes comprising main group elements, metals or transition elements, such as, for example, copper bis(hexafluoroacetylacetonate) Cu(C5F6HO2)2, dimethylgold trifluoroacetylacetonate Me2Au(C5F3H4O2), and/or organic compounds such as carbon monoxide CO, carbon dioxide CO2, aliphatic and/or aromatic hydrocarbons, and such like.

Appropriate process gases suitable for etching material in interaction with the particle beam are for example: Xenon difluoride XeF2, xenon dichloride XeCl2, xenon tetrachloride XeCl4, water vapor H2O, heavy water D2O, oxygen O2, ozone O3, ammonia NH3, nitrosyl chloride NOCl and/or one of the following halide compounds: XNO, XONO2, X2O, XO2, X2O2, X2O4, X2O6, where X is a halide. Further process gases for etching material are specified in the present applicant's US patent application having the Ser. No. 13/103,281, filed on May 9, 2011, published as US 2012/0273458 A1.

Additive gases, which can be admixed for example in proportions with the process gas in order to better control the processing process, comprise for example oxidizing gases such as hydrogen peroxide $H_2O_2$, nitrous oxide $N_2O$, nitrogen oxide NO, nitrogen dioxide $NO_2$, nitric acid $HNO_3$, and further oxygen-containing gases, and/or halides such as chlorine $Cl_2$, hydrogen chloride HCl, hydrogen fluoride HF, iodine $I_2$, hydrogen iodide HI, bromium $Br_2$, hydrogen bromide HBr, phosphorus trichloride $PCl_3$, phosphorus pentachloride $PCl_5$, phosphorus trifluoride $PF_3$, and further halogen-containing gases, and/or reducing gases, such as hydrogen $H_2$, ammonia $NH_3$, methane $CH_4$ and further hydrogen-containing gases. These additive gases can be used for example for etching processes, as buffer gases, as passivating media and such like.

In embodiments, the adjustment of the shielding element and/or of the holder, which will be explained in even greater detail later, alters the feed of process gas in relation to the processing location.

In accordance with one embodiment, the apparatus comprises a vacuum housing for providing a vacuum within same, wherein at least the shielding element and the adjusting unit are arranged in the vacuum housing.

This provides a simple solution in which there is no need to break the vacuum for the adjustment of the position of the shielding element. In the presence of vacuum—in particular in the absence of process gases—the residual gas pressure in the vacuum housing is preferably between $2 \times 10^{-07}$ and $4 \times 10^{-07}$ mbar, preferably $3 \times 10^{-07}$ mbar.

The apparatus preferably comprises a sample stage for holding the sample. Preferably, the sample stage is arranged in the vacuum housing. The apparatus comprises for example a positioning unit for positioning the sample stage in relation to the providing unit. The positioning unit can be configured for example to displace the sample stage along three spatial axes. In addition, the positioning unit can be configured to rotate the sample stage about at least one of said axes, preferably about at least two of said axes. The sample stage is preferably held by a holding structure in a vibration-decoupled manner and/or in an actively damped manner.

In accordance with one embodiment, the detecting unit comprises an electron microscope, in particular a scanning electron microscope.

The position of the shielding element, in particular the position of the through opening, can thereby be detected accurately. Advantageously, the apparatus provided for the analysis and/or the processing of the sample is simultaneously also used as a detecting unit for detecting the position of the shielding element.

In accordance with one embodiment, provision is made of a securing device for securing the shielding element in a frictionally locking manner, wherein the adjusting unit is configured to move the shielding element from the actual position thereof into the target position thereof while overcoming the frictional locking.

The securing device can be provided on the providing unit, in particular on a lower end thereof. The securing device can be embodied integrally or in one piece with the providing unit. A predefined force has to be expended in order to overcome the frictional locking. In particular, the securing device can comprise one or more clamps, by use of which the shielding element or a holder holding the shielding element is clamped against a friction surface (here also referred to as "counterholder surface"). The clamping force results in a frictional force perpendicular thereto which counteracts displacement of the shielding element or of the holder thereof along the friction surface. The friction surface can be an end surface of the providing unit which faces in particular the sample stage and/or downwards.

In accordance with a further embodiment, the adjusting unit is able to be operatively connected to the shielding element.

The operative connection can be such that the adjusting unit acts on the shielding element indirectly or directly. It can furthermore be configured as permanent or releasable. The operative connection can be provided in particular mechanically and/or electromagnetically. In particular, for the purpose of adjustment, the adjusting unit can be releasably connected or connectable to the shielding element or a holder holding the shielding element.

In accordance with a further embodiment, the apparatus comprises an engagement element and a receiving element, which are able to be engaged with one another in a releasable manner in order to provide the operative connection, wherein the adjusting unit comprises one element from the engagement element and the receiving element and the shielding element or a holder holding the shielding element comprises the respective other element from the engagement element and the receiving element.

The engagement element and the receiving element form a releasably connectable positively locking fit. The operative connection can thereby be produced particularly simply. The positively locking fit is preferably produced by the engagement element being moved into the receiving element in a vertical direction.

In accordance with a further embodiment, the engagement element is embodied as a pin and/or the receiving element is embodied as a hole, in particular as a hole in the shielding element or the holder.

In particular, the pin is moved along its longitudinal axis in order to engage in the hole in a positively locking manner. The pin can have a circular-cylindrical outer contour, wherein the hole can have a corresponding circular inner contour.

In accordance with a further embodiment, the apparatus comprises a force transmission element for providing the operative connection between the adjusting unit and the shielding element, wherein a mechanical stability of the force transmission element is chosen such that a force transmission along the operative connection is limited to a predefined measure, wherein the force transmission element has in particular a predetermined breaking point and/or the engagement element forms the force transmission element.

This makes it possible to ensure that the adjusting unit can displace the shielding element within a predefined scope; on the other hand, upon reaching the limits of this scope (which is predefined by stops, in particular) and thus with the threat of damage to other parts of the apparatus, exertion of force on these other parts is limited.

In accordance with a further embodiment, provision is made of a further detecting unit configured to detect a position of the engagement element in relation to the receiving element.

The engagement process can thereby be effected in a controlled manner, whereby this process can be effected more rapidly and/or without potential damage to other parts of the apparatus.

In accordance with a further embodiment, the further detecting unit comprises a camera and/or records an image by use of a deflection mirror.

The engagement element can thereby be observed particularly simply.

In accordance with a further embodiment, the engagement element projects from the deflection mirror. Alternatively, the receiving element could also be shaped into the deflection mirror or penetrate through the latter.

As a result, the engagement element can be introduced into the receiving element particularly simply because the outer contour of the engagement element and the inner contour of the receiving element can be observed by use of the deflection mirror.

In accordance with a further embodiment, the adjusting unit has a sample stage for holding the sample and/or a sample.

Advantageously, the inherently provided sample stage is simultaneously used as an adjusting unit, that is to say that the sample stage acts on the shielding element directly or indirectly. Optionally, it is also possible to use a special sample (so-called service sample) that is moved by use of the sample stage, wherein the sample acts on the shielding element directly or indirectly. In particular, the engagement element or the receiving element is fixedly provided on the sample stage or the sample.

In accordance with a further embodiment, the adjusting unit is configured to displace the shielding element in a direction transversely with respect to the optical axis of the providing unit.

In principle, the adjustment of the actual position into the target position can comprise positioning the shielding element in up to six degrees of freedom (three rotational and three translational). Preferably, however, just mechanically easily implementable displacement of the shielding element transversely with respect to the optical axis of the providing unit is provided.

In accordance with a further embodiment, provision is made of a circulating plate for providing process gases, wherein the shielding element, in terms of its actual and target positions, is in each case secured to the circulating plate in a releasable manner.

In particular, the circulating plate can comprise the securing device for releasably securing the shielding element or the holder thereof.

In accordance with a second aspect, a method for setting a position of a shielding element in an apparatus for analyzing and/or processing a sample with a particle beam is provided. The method comprises the following steps:

a) mounting the shielding element in a vacuum housing of the apparatus;
    b) producing the vacuum in the vacuum housing;
    c) detecting an actual position of the shielding element; and
    d) adjusting the shielding element from the actual position into a target position in the presence of vacuum.

Advantageously, the vacuum is not broken while steps c) and d) are carried out. The adjustment outlay is considerably reduced as a result. The apparatus can be, in particular, the apparatus in accordance with the first aspect. The steps do not have to proceed in the order indicated by a)-d). By way of example, step c) can be carried out before step b).

Further possible implementations of the invention also comprise not explicitly mentioned combinations of features or embodiments that are described above or below with respect to the exemplary embodiments. In this case, a person skilled in the art will also add individual aspects as improvements or supplementations to the respective basic form of the invention.

Further advantageous configurations and aspects of the invention are the subject matter of the dependent claims and also of the exemplary embodiments of the invention described below. In the text that follows, the invention is explained in more detail on the basis of preferred embodiments with reference to the accompanying figures.

BRIEF DESCRIPTION OF DRAWINGS

FIG. 6 shows the apparatus from FIG. 5 together with a camera directed at a deflection mirror, for illustrating a further embodiment;

FIGS. 7A and 7B show by way of example different positions of the shielding element in the case of the apparatus from FIG. 5.

DETAILED DESCRIPTION

Identical elements or elements having an identical function have been provided with the same reference signs in the figures, unless indicated to the contrary. It should also be noted that the illustrations in the figures are not necessarily true to scale.

Figure 1:
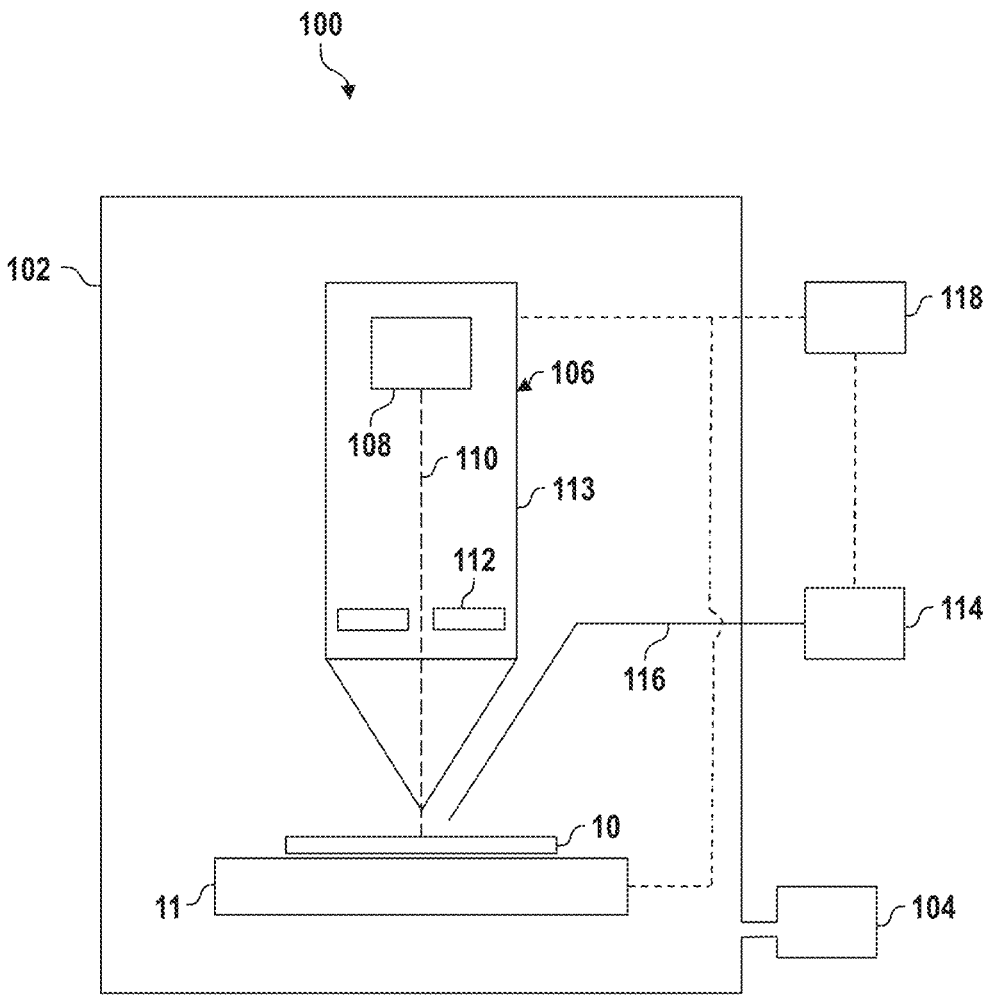
FIG. 1 shows a schematic view of a first exemplary embodiment of an apparatus for analyzing and/or processing a sample with a particle beam.

FIG. 1 shows a schematic view of a first exemplary embodiment of an apparatus 100 for analyzing and processing a sample 10. The apparatus 100 comprises a vacuum housing 102, the interior of which is kept at a specific vacuum by a vacuum pump 104.

The apparatus 100 is configured in particular for analyzing and processing samples 10, in particular in the form of lithography masks. By way of example, the apparatus is a verification and/or repair tool for lithography masks, in particular for lithography masks for EUV (stands for: extreme ultraviolet) or DUV (stands for: deep ultraviolet) lithography. In this case, a sample 10 to be analyzed or to be processed is mounted on a sample stage 11 in the vacuum housing 102. The sample stage 11 of the apparatus 100 is configured in particular to set the position of the sample 10 in three spatial directions and in three axes of rotation accurately to a few nanometers.

The apparatus 100 furthermore comprises a providing unit 106 in the form of an electron column. The latter comprises an electron source 108 for providing an electron beam 110 (particle beam) and an electron microscope 112, which detects the electrons backscattered from the sample 10. An ion beam could also be provided instead of the electron beam 110. A further detector for secondary electrons can also be provided (not illustrated). The electron column 106 preferably has a dedicated vacuum housing 113 within the vacuum housing 102. The vacuum housing 113 is evacuated to a residual gas pressure of $10^{-7}$ mbar-$10^{-8}$ mbar, for example. The electron beam 110 from the electron source 108 passes in this vacuum until it emerges from the vacuum housing 113 at the underside thereof and is then incident on the sample 10.

The electron column 106 can carry out electron beam-induced processing processes (EBIP) in interaction with process gases fed in, which are fed by a gas providing unit 114 from outside via a gas line 116 into the region of a focal point of the electron beam 110 on the sample 10. This comprises in particular depositing material on the sample 10 and/or etching material therefrom. The apparatus 100 furthermore has a control computer 118, which suitably controls the electron column 106, the sample stage 11 and/or the gas providing unit 114.

Figure 2:
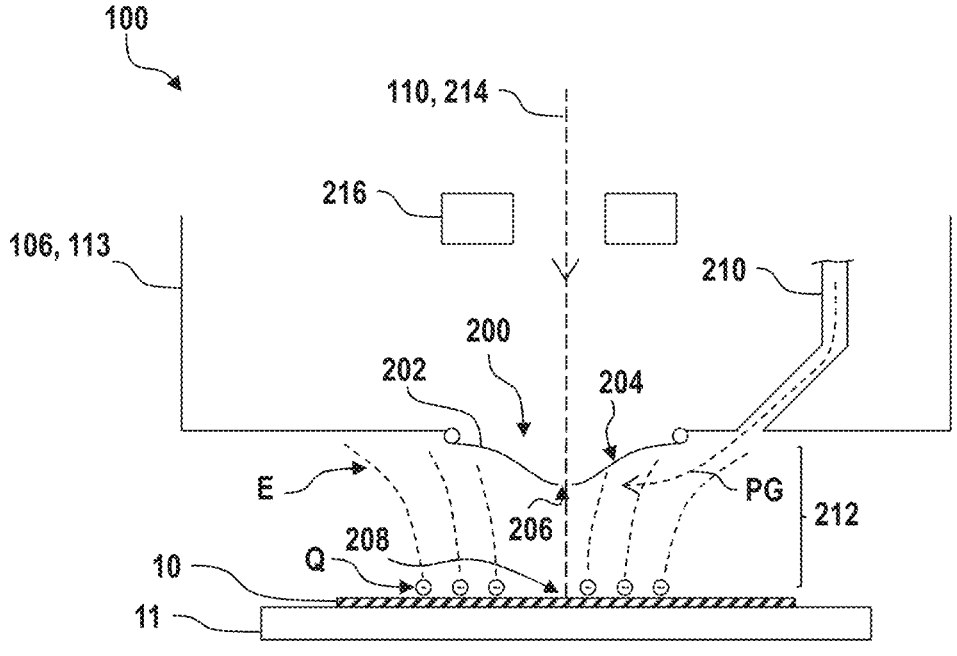
FIG. 2 shows an excerpt from a schematic view of a second exemplary embodiment of an apparatus for analyzing and/or processing a sample with a particle beam.

FIG. 2 shows an excerpt from a schematic view of a second exemplary embodiment of an apparatus 100 for analyzing and/or processing a sample 10 with a particle beam 110. Unless described otherwise below, the apparatus 100 in FIG. 2 can have the same features as the apparatus 100 in FIG. 1.

An opening 200 for the electron beam 110 is arranged at the underside of the vacuum housing 113. The opening 200 is partly or completely closed by a shielding element 202. The shielding element 202 is embodied in sheetlike fashion and comprises an electrically conductive material, in particular gold. The shielding element 202 can have a convex section 204, this section being convex relative to the sample stage 11. The convex section 204 curves in the direction of the sample stage 11. The convex section 204 (or—if such a section is not present—generally shielding element 202) has a through opening 206 for the electron beam 110 to pass through. The distance between the shielding element 202 and the sample stage 11 is preferably the smallest in the region of the through opening 206. The distance between the through opening 206 and the sample 10 is preferably between 1 μm-100 μm, preferably between 5 μm-30 μm, and more preferably 10 μm, during operation (analysis/processing of the sample 10) of the apparatus 100.

The shielding element 202 is configured to shield an electric field E. In order to clarify this, charges Q that generate the electric field E are illustrated by way of example in FIG. 2. The charges Q are illustrated below the shielding element 202, in a region where a processing region 208 of the sample 10 is situated during use of the apparatus 100. Particularly in the case of samples 10 which are electrically non-conductive or only slightly conductive (at least in sections), when the electron beam 110 is incident on the sample 10, charging of the sample 10 and thus the formation of the electric field E occurs. Negative charges Q that arise as a result of incidence of the electron beam 110 are shown by way of example in FIG. 1.

As a result of the shielding of the electric field E, firstly, an increased accuracy is achieved with regard to an impingement point and a focus position of the electron beam 110 on the sample 10, which improves a resolution and process control. Secondly, a flight trajectory of backscattered electrons and secondary electrons which fly counter to the electron beam 110 in the direction of the electron source 108 is influenced to a lesser extent, which likewise improves the resolution and the process control and additionally a sensitivity.

In this example, the providing unit 106 comprises a gas feed 210 configured for feeding a process gas PG into a gap 212 between the shielding element 202 and the sample 10. The process gas PG flows along the gap 212 and thus reaches the processing position 208 on the sample 10. By use of the gas feed 210, therefore, firstly it is ensured that the processing position 208 is sufficiently supplied with process gas PG, and secondly a volumetric flow rate of the process gas PG through the through opening 206 into the providing unit 106 is comparatively low, in particular lower than if the process gas PG were guided through the through opening 206 from above to the processing position 208.

Figure 3:
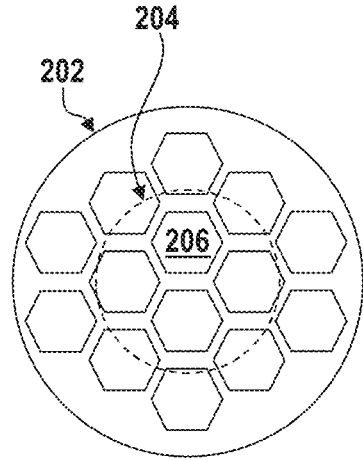
FIG. 3 shows one exemplary embodiment of a shielding element in a plan view.

FIG. 3 shows one example of a shielding element 202 having a plurality of through openings 206, only one of which is identified by a reference sign for the sake of better clarity. The through openings 206 here all have a hexagonal geometry. In this example, a plurality of through openings 206 are likewise situated in the convex section 204, at least partly in each case.

Figures 4, 5:
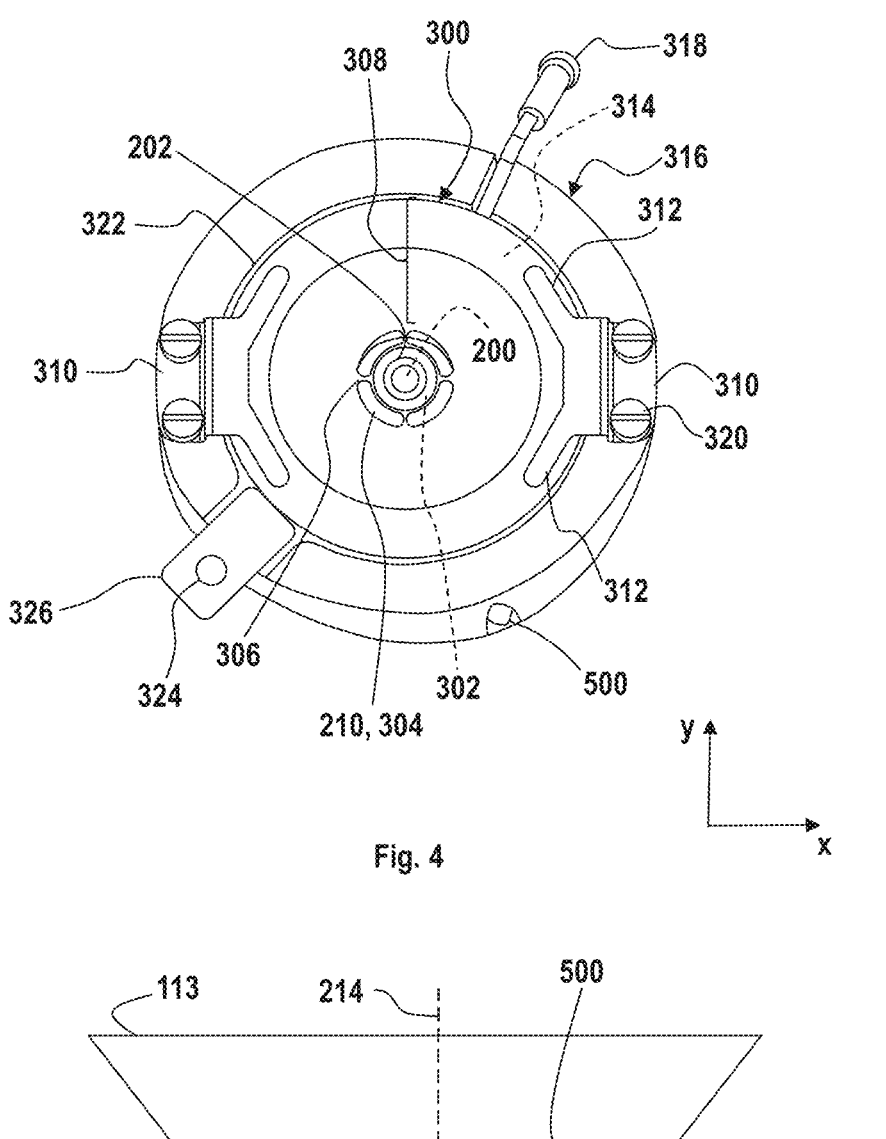
FIG. 4 shows in perspective view a plurality of components of a third exemplary embodiment of an apparatus for analyzing and/or processing a sample with a particle beam.
FIG. 5 shows the components from FIG. 4 in a state installed in the apparatus.

FIG. 4 shows in perspective view a plurality of components of a third exemplary embodiment of an apparatus 100 for analyzing and/or processing a sample 10 with a particle beam 110. FIG. 5 shows the components in a state installed in the apparatus 100. FIG. 6 shows the apparatus 100 from FIG. 5 together with a camera. Unless described otherwise below, the apparatus 100 in FIGS. 4 to 6 can have the same features as the apparatus 100 in FIGS. 1 and 2. The shielding element 202 can be embodied as in FIG. 3.

The shielding element 202 in FIG. 4 is held by use of a holder 300. For this purpose, the shielding element 202 can be secured to the holder 300, in particular to a ring 302 thereof, said ring being illustrated only in a concealed manner. By way of example, welding, soldering or adhesive bonding is appropriate as securing. Alternatively, the shielding element 202 can be integrated into the holder 300, that is to say can be formed in particular integrally with the latter.

In accordance with the exemplary embodiment, the holder 300 has the opening 200 (shown in a concealed manner because it is behind the shielding element 202), which is closed by the shielding element 202. The opening 200 can be formed in particular within the ring 302.

The holder 300 can furthermore comprise the gas feed 210, in particular in the form of openings or holes 304. Four holes 304 are provided in the example, where the number of holes can vary in particular between 2 and 6. The process gas PG is fed to the processing location 208 (see FIG. 2) via the holes 304 (cf. FIG. 2). The holes 304 can be formed by virtue of webs 306 connecting the ring 302 to a section 308 of the holder 300. The holder 300 can be fabricated from metal, an alloy or plastic.

The holder 300 is clamped in a frictionally locking manner with the aid of one or more clamps 310—two of such clamps 310 are provided here. The clamping forces can act on the section 308, in particular. By way of example, the clamps 310 can have arms 312 that act on the holder 300 or the section 308. A section of the electron column 106 can serve—very generally—as a counterholder surface 314 for producing the clamping effect together with the clamps 310 or the arms 312 thereof. In particular, an underside of the vacuum housing 113 serves as a counterholder surface 314. In the exemplary embodiment, a plate secured to or in the region of the underside of the vacuum housing 113, in particular a circulating plate 316, has the counterholder surface 314. The circulating plate 316 has connections 500 (one such connection is shown by way of example) for the process gas PG, said connections also being shown in FIG. 5, which illustrates the circulating plate 316 in a simplified manner. Via channels 210 (see FIG. 2) formed in the circulating plate 316, the connections 500 are configured to feed the process gas PG to the processing region 208 optionally through the holes 304.

Alternatively or additionally, the circulating plate 316 (or plate) can have a beam deflecting device 216 secured thereto or integrated therein (see FIG. 2). With the aid of the beam deflecting device 216, the electron beam 110 is deflected for the purpose of processing the processing region 208. The beam deflecting device 216 comprises a plurality of, for example, between four and sixteen, preferably six to ten, in particular eight (the beam deflecting device 216 is therefore also referred to as an octupole) coils or electromagnets (none of which is shown because they are concealed), which are arranged around an optical axis 214 of the electron column 106. Current connections 318, one of which is shown by way of example in FIG. 4, supply the electromagnets with current.

The holder 300 together with shielding element 202 is provided such that it is adjustable, i.e. movable, between an actual position and a target position. In this case, FIG. 4 shows the actual position. The actual position is detected by a detecting unit, which, in accordance with the exemplary embodiment, is formed by the electron microscope 112, which is a scanning electron microscope, in particular. Said microscope detects the electrons backscattered from the shielding element 202. A corresponding detection image is shown in FIG. 7A, wherein 206 denotes the through opening which is intended to be positioned relative to the optical axis 214 of the electron column 106. The optical axis 214 is shown collinearly with the electron beam 110 in FIGS. 1 and 2. The optical axis 214 thus extends in the vertical direction and intersects a center point of the opening 200.

A positioning of the holder 300 or of the shielding element 202 in all six degrees of freedom is conceivable in principle. In accordance with the exemplary embodiment, the positioning is effected only in a plane perpendicular to the optical axis 214, that is to say here in the horizontal direction (x-y-plane in FIG. 4). In this case, the counterholder surface 314 serves as a sliding or bearing surface that guides a displacement of the holder 300 in the horizontal direction. For the sliding movement, it is necessary to overcome the frictional force acting between the holder 300 and the counterholder surface 314. The frictional force can be set with the aid of screws 320 that hold the clamps 310 on the counterholder surface 314. The counterholder surface 314 can be recessed into the circulating plate 316, as shown, thus resulting in an edge 322. The edge 322 delimits the displacement movement of the holder 300 in the x-y-plane, that is to say forms an end stop for said holder. A receiving element in the form of a hole 324 in a lug 326 shaped integrally on the holder 300 is provided on the holder 300. The hole plane is likewise arranged in the x-y-plane.

The adjustment of the holder 300 together with the shielding element 202 is effected with the aid of an adjusting unit 600 shown in FIG. 6 (in part also in FIG. 5). In accordance with the exemplary embodiment, the adjusting unit 600 comprises the sample stage 11, to which an engagement element 602 is secured, which here is embodied in particular as a pin projecting vertically upwards. The pin 602 could alternatively also be fitted on a sample 10 (so-called service sample) provided especially for this purpose, said sample being arranged temporarily (namely only for the duration of adjustment) on the sample stage 11.

In the exemplary embodiment, provision is made for the pin 602 to project from a deflection mirror 502 (see FIG. 5). The deflection mirror 502 is arranged obliquely with respect to the optical axis 214. For this purpose, said deflection mirror can be embodied for example on a block 504 shaped to form a wedge or in prismatic fashion. The block 504 is in turn secured on the sample stage 11 or the sample 10.

As shown in FIG. 6, a further detecting unit 606 in the form of a camera is arranged outside the interspace 604 between the sample stage 11 and the electron column 106 in the horizontal direction. By use of the camera 606 and the deflection mirror 502, it is possible to observe the position of the pin 602 relative to the hole 324 on the lug 326 of the holder 300, as indicated by an arrow in FIG. 6. The sample stage 11 is then controlled suitably with the aid of the control computer 118 (see FIG. 1), for example, in order to insert the pin 602 into the hole 324 in the vertical direction. Afterwards, the pin 602 is displaced in the horizontal plane by use of the sample stage 11, which simultaneously leads to a movement of the holder 300 together with the shielding element 202 as soon as a predetermined frictional force value is exceeded. As a result, the holder 300 and thus the shielding element 202 are displaced and the through opening 206 in the shielding element 202 is brought to the target position shown in FIG. 7B.

In order to avoid damage within the apparatus 100, in particular to the holder 300 or the shielding element 202, by use of the pin 602, for example in the event of improper movement thereof, said pin can be provided with a predetermined breaking point 506 (see FIG. 5). The pin 602 breaks off at said predetermined breaking point if a force that exceeds a predefined force limit is applied to said pin, in particular to the free tip thereof. In particular, this is the case if the holder 300 is pressed against the edge 322 (see FIG. 4) by use of the pin 602 and the force expended exceeds the predefined force limit.

Figure 8:
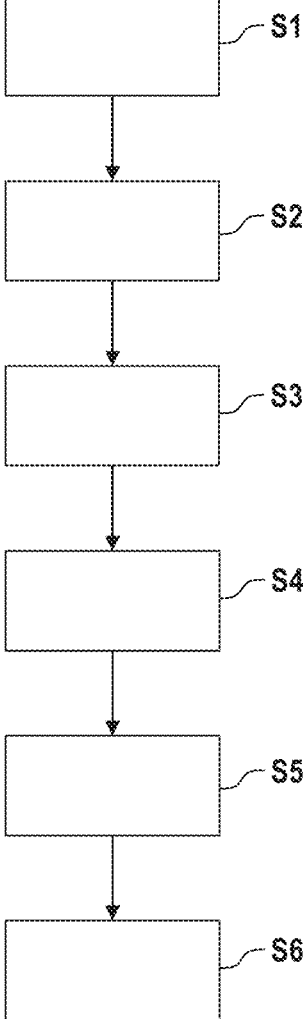
FIG. 8 shows a plurality of method steps in accordance with one embodiment in a flow diagram.

FIG. 8 shows a plurality of method steps in accordance with one embodiment in a flow diagram.

Firstly, upon new production of the apparatus 1 or upon exchange of the shielding element 202 (optionally together with holder 300), a new shielding element 202 is mounted on the counterholder surface 314 (step S1 in FIG. 8). This is done with the aid of the clamps 310 and tightening of the screws 320. At this point in time the vacuum housing 102 is open, that is to say that the vacuum in the vacuum housing 102 has been broken. The mounting of the holder 300 together with the shielding element 202 can take place in the state in which the circulating plate 316 is demounted from the vacuum housing 102, that is to say that after the mounting of the holder 300, said circulating plate is brought into the vacuum housing 102 again and mounted on the electron column 106. Alternatively, the mounting of the holder 300 together with the shielding element 202 takes place in the vacuum housing 102, i.e. on the circulating plate 316 already mounted on the electron column 106.

The vacuum in the vacuum housing 102 is subsequently re-established with the aid of the vacuum pump 104 (step S2). As a result, in particular the holder 300 together with the shielding element 202 and also the sample stage 11 are situated in a vacuum.

Step S3 involves detecting the actual position of the shielding element 202, in particular of the through opening 206, in relation to the optical axis 214, with the aid of the electron microscope 112 (see FIG. 1).

From a target position of the shielding element 202, said target position being provided to the control computer 118 or being calculated by the latter, said control computer or some other computer unit determines, in a step S4, a travel path along which the sample stage 11 is intended to be moved in order to suitably move the shielding element 202 with the aid of the pin 602. Afterwards, the sample stage 11 or the pin 602 moves accordingly (step S5). In other words, the pin 602 firstly engages into the hole 324 by virtue of it moving vertically and optionally horizontally. The pin 602 is then moved horizontally in order to displace the shielding element 202 in the x-y-plane and to bring it from the actual position into the target position. The current actual position is continuously sampled by the electron microscope 112, for example with a sampling rate of 100 Hz. As soon as the target position has been reached, the pin 602 and the hole 324 are disengaged again. In particular, the engaging and disengaging of the pin 602 and the hole 324 are monitored by use of the camera 606, wherein the latter in embodiments passes corresponding measurement data to the control computer 118, such that the movement of the sample stage 11 can be effected under closed-loop control.

The sample stage 11 can then move into a change position (step S6), in which the block 504 together with the pin 602 is removed. This can be effected optionally with the aid of an automatic tool changer.

Afterwards—optionally with the omission of step S6—in step S7 the analysis and/or processing of the sample 10 in the processing region 208 (FIG. 2) begins, optionally without the vacuum provided in step S2 being broken in the meantime.

Although the present invention has been described on the basis of exemplary embodiments, it is modifiable in diverse ways.

LIST OF REFERENCE SIGNS

10 Sample
11 Sample stage
100 Apparatus
102 Vacuum housing
104 Vacuum pump
106 Electron column
108 Electron source
110 Electron beam
112 Electron microscope
113 Vacuum housing
114 Gas providing unit
116 Gas line
118 Control computer
200 Opening
202 Shielding element
204 Convex section
206 Through opening
208 Processing region
210 Gas feed
212 Gap
214 Optical axis
216 Beam deflecting device
300 Holder
302 Ring
304 Holes
306 Web
308 Section
310 Clamp
312 Arm
314 Counterholder surface
316 Circulating plate
318 Current connection
320 Screw
322 Edge
324 Hole
326 Lug
500 Connection
502 Deflection mirror
504 Block
506 Predetermined breaking point
600 Adjusting unit
602 Pin
604 Interspace
606 Camera
E Field lines
Q Charges x Direction
y Direction

What is claimed is:

1. An apparatus for analyzing and/or processing a sample with a particle beam, comprising:
   a providing unit for providing the particle beam;
   a shielding element for shielding an electric field (E) generated by charges (Q) accumulated on the sample when the shielding element is at a distance from the sample of at most 100 μm, wherein the shielding element has a through opening for the particle beam to pass through towards the sample;
   a detecting unit configured to detect an actual position of the shielding element;
   an adjusting unit for adjusting the shielding element from the actual position into a target position; and
   a securing device for securing the shielding element in a frictionally locking manner, and wherein the adjusting unit is configured to move the shielding element from the actual position thereof into the target position thereof while overcoming the frictional locking.

2. The apparatus of claim 1, comprising a vacuum housing for providing a vacuum within same, wherein at least the shielding element and the adjusting unit are arranged in the vacuum housing.

3. The apparatus of claim 2, wherein the detecting unit comprises an electron microscope, in particular a scanning electron microscope.

4. The apparatus of claim 1, wherein the adjusting unit is able to be operatively connected to the shielding element.

5. The apparatus of claim 1, furthermore comprising an engagement element and a receiving element, which are able to be engaged with one another in a releasable manner in order to provide an operative connection, wherein the adjusting unit comprises one element from the engagement element and the receiving element and the shielding element or a holder holding the shielding element comprises the respective other element from the engagement element and the receiving element.

6. The apparatus of claim 1, furthermore comprising an engagement element and a receiving element, wherein the engagement element is embodied as a pin and/or the receiving element is embodied as a hole, in particular as a hole in the shielding element or a holder.

7. The apparatus of claim 6, wherein the engagement element forms a force transmission element for providing an operative connection between the adjusting unit and the shielding element, wherein a mechanical stability of the force transmission element is chosen such that a force transmission along the operative connection is limited to a predefined measure.

8. The apparatus of claim 1, comprising a further detecting unit configured to detect a position of an engagement element in relation to a receiving element.

9. The apparatus of claim 8, wherein the further detecting unit comprises a camera and/or records an image with the aid of a deflection mirror.

10. The apparatus of claim 8, wherein the engagement element projects from a deflection mirror.

11. The apparatus of claim 8, wherein the adjusting unit has a sample stage for holding the sample and/or a sample.

12. The apparatus of claim 8, wherein the adjusting unit is configured to displace the shielding element in a direction transversely with respect to the particle beam.

13. The apparatus of claim 1, comprising a circulating plate for providing process gases, wherein the shielding element, in terms of its actual and target positions, is in each case secured to the circulating plate in a releasable manner.

14. A method for setting a position of a shielding element in an apparatus for analyzing and/or processing a sample with a particle beam, wherein the shielding element is for shielding an electric field (E) generated by charges (Q) accumulated on the sample when the shielding element is at a distance from the sample of at most 100 μm, and wherein the method comprises the following steps:

a) mounting the shielding element in a vacuum housing of the apparatus, wherein the shielding element is secured in a frictionally locking manner;

b) producing the vacuum in the vacuum housing;

c) detecting an actual position of the shielding element; and d) adjusting the shielding element from the actual position into a target position in the presence of vacuum while overcoming the frictional locking.

15. The apparatus of claim 2, wherein the adjusting unit is able to be operatively connected to the shielding element.

16. The apparatus of claim 3, wherein the adjusting unit is able to be operatively connected to the shielding element.

17. The apparatus of claim 2, furthermore comprising an engagement element and a receiving element, which are able to be engaged with one another in a releasable manner in order to provide an operative connection, wherein the adjusting unit comprises one element from the engagement element and the receiving element and the shielding element or a holder holding the shielding element comprises the respective other element from the engagement element and the receiving element.

18. The apparatus of claim 3, furthermore comprising an engagement element and a receiving element, which are able to be engaged with one another in a releasable manner in order to provide an operative connection, wherein the adjusting unit comprises one element from the engagement element and the receiving element and the shielding element or a holder holding the shielding element comprises the respective other element from the engagement element and the receiving element.

19. The apparatus of claim 2, furthermore comprising an engagement element and a receiving element, wherein the engagement element is embodied as a pin and/or the receiving element is embodied as a hole, in particular as a hole in the shielding element or a holder.

20. The apparatus of claim 5, wherein the engagement element forms a force transmission element for providing the operative connection between the adjusting unit and the shielding element, wherein a mechanical stability of the force transmission element is chosen such that a force transmission along the operative connection is limited to a predefined measure.

* * * * *